United States Patent [19]
Kwon

[11] Patent Number: 5,502,672
[45] Date of Patent: Mar. 26, 1996

[54] DATA OUTPUT BUFFER CONTROL CIRCUIT

[75] Inventor: Gi W. Kwon, Kyoungki-do, Rep. of Korea

[73] Assignee: Hyundai Electronics Industries Co., Ltd., Kyoungki-do, Rep. of Korea

[21] Appl. No.: 382,757

[22] Filed: Feb. 2, 1995

[30] Foreign Application Priority Data

Feb. 3, 1994 [KR] Rep. of Korea .................. 94-1939

[51] Int. Cl.⁶ .................................................. G11C 7/00
[52] U.S. Cl. ................. 365/189.05; 365/194; 365/233.5
[58] Field of Search .............................. 365/189.05, 194, 365/233.5, 189.01, 200

[56] References Cited

U.S. PATENT DOCUMENTS

| | | | |
|---|---|---|---|
| 4,802,127 | 1/1989 | Akaogi et al. | 365/189.05 |
| 5,307,324 | 4/1994 | Nishimoto | 365/189.05 |
| 5,384,737 | 1/1995 | Childs et al. | 365/189.05 |

*Primary Examiner*—Tan T. Nguyen
*Attorney, Agent, or Firm*—Popham, Haik, Schnobrich & Kaufman, Ltd.

[57] ABSTRACT

In a semiconductor memory device having a plurality of memory cells and a data output buffer for transferring a data signal from the memory cells to external peripheral circuits, a circuit for controlling the data output buffer, comprising a address transition detector for detecting a transition of an address signal to generate an address transition detect signal in a pulse form, a delay controller for generating a delay control signal, the delay control signal having a logic value set by a manufacturer according to whether the semiconductor memory device has a repaired memory cell, and an output enable signal generator for generating an output enable signal at a time point delayed by a time period from the generation of the address transition detect signal from the address transition detector, the time period being determined based on a logic value of the delay control signal from the delay controller, the output enable signal generator outputting the output enable signal to the data output buffer to control an operating point of the data output buffer. According to the present invention, the operating point of the data output buffer is controlled according to whether the semiconductor memory device has the repaired memory cell. Therefore, the semiconductor memory device has an enhanced data read speed.

3 Claims, 2 Drawing Sheets

DATA OUTPUT BUFFER CONTROL CIRCUIT

BACKGROUND OF THE INVENTION

1. Field of the Invention

The present invention relates in general to a circuit for controlling a data output buffer of a semiconductor memory device, and more particularly to a data output buffer control circuit for controlling an operating point of the data output buffer according to the presence of a repaired memory cell in the semiconductor memory device to enhance a data read speed of the semiconductor memory device.

2. Description of the Prior Art

Generally, a data output buffer control circuit is adapted to generate an output enable signal synchronously with a time point that a data signal read from memory cells is arrived at an input line of a data output buffer. However, the read data signal when a repaired memory cell is present among the memory cells is arrived at the input line of the data output buffer later than that when no repaired memory cell is present among the memory cells. Namely, a semiconductor memory device including the repaired memory cell has a data read speed lower than that including no repaired memory cell. The lower data read speed based on the presence of the repaired memory cell causes the data output buffer to generate error data in response to the earlier output enable signal from the data output buffer control circuit.

In order to overcome the above problem, there has been proposed a data output buffer control circuit which comprises a delay circuit including an inverter chain and a capacitor for delaying an address transition detect signal from an address transition detector. In the case where the semiconductor memory device has the repaired memory cell, such a conventional data output buffer control circuit with the delay circuit generates an output enable signal synchronously with the read data signal from the memory cells of the semiconductor memory device being supplied to the input line of the data output buffer, to allow the data output buffer to buffer accurately the data signal. However, in the case where the semiconductor memory device has no repaired memory cell, the conventional data output buffer control circuit generates the output enable signal delayed by a delay time of the delay circuit from the read data signal from the memory cells of the semiconductor memory device being supplied to the input line of the data output buffer, resulting in a degradation in a response speed of the data output buffer for the input. As a result, the conventional data output buffer control circuit has the disadvantage that it degrades the data read speed of the semiconductor memory device including no repaired memory cell.

SUMMARY OF THE INVENTION

Therefore, the present invention has been made in view of the above problem, and it is an object of the present invention to provide a data output buffer control circuit for controlling an operating point of a data output buffer according to the presence of a repaired memory cell in a semiconductor memory device to enhance a data read speed of the semiconductor memory device and to prevent an error in an output data signal from the semiconductor memory device having the repaired memory cell.

In accordance with an embodiment of the present invention, in a semiconductor memory device having a plurality of memory cells and a data output buffer for transferring a data signal from the memory cells to external peripheral circuits, there is provided a circuit for controlling the data output buffer. The data output buffer control circuit comprises an address transition detector for detecting a transition of an address signal to generate an address transition detect signal in a pulse form; a delay controller for generating a delay control signal, the delay control signal having a logic value set by a manufacturer according to whether the semiconductor memory device has a repaired memory cell; and an output enable signal generator for generating an output enable signal at a time point delayed by a time period from the generation of the address transition detect signal from the address transition detector, the time period being determined based on a logic value of the delay control signal from the delay controller, the output enable signal generator outputting the output enable signal to the data output buffer to control an operating point of the data output buffer.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
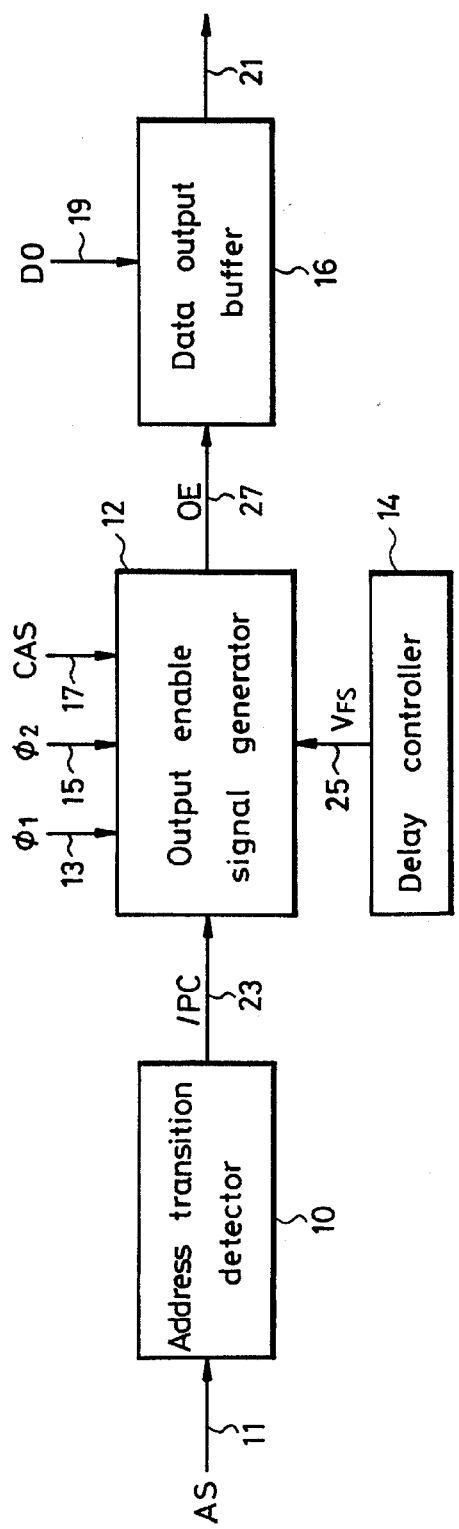
FIG. 1 is a block diagram of a data output buffer control circuit in accordance with an embodiment of the present invention.

Referring to FIG. 1, there is shown a block diagram of a data output buffer control circuit in accordance with an embodiment of the present invention. As shown in this drawing, the data output buffer control circuit comprises an address transition detector 10 for inputting an address signal AS from a first input line 11, and a delay controller 14 for generating a delay control signal $V_{FS}$. The address transition detector 11 is adapted to generate an address transition detect signal /PC when the address signal AS is changed from high and/or low to low and/or high in logic, the generated address transition detect signal /PC having a pulse with a desired high or low duration. The address transition detector 11 outputs the address transition detect signal /PC through its output line 23.

The delay controller 14 includes a fuse F1 (see FIG. 4) which is selectively opened or closed by a manufacturer to allow the delay control signal $V_{FS}$ to have a high or low logic. In practice, the delay control signal $V_{FS}$ is high in logic when a semiconductor memory device has a repaired memory cell. On the contrary, the delay control signal $V_{FS}$ is low in logic when the semiconductor memory device has only normal memory cells.

The data output buffer control circuit further comprises an output enable signal generator 12 for inputting the address transition detect signal /PC from the output line 23 of the address transition detector 10 and the delay control signal $V_{FS}$ from an output line 25 of the delay controller 14. The output enable signal generator 12 is adapted to delay variably the address transition detect signal /PC from the address transition detector 10 according to a logic state of the delay control signal $V_{FS}$ from the delay controller 14. In practice, when the delay control signal $V_{FS}$ from the delay controller 14 is high in logic, the output enable signal generator 12 delays the address transition detect signal /PC from the address transition detector 10 for a first predetermined time period. On the contrary, if the delay control signal $V_{FS}$ from the delay controller 14 is low in logic, the output enable signal generator 12 delays the address transition detect signal /PC from the address transition detector 10 for a second predetermined time period which is shorter than the first predetermined time period. Further, the output enable signal generator 12 inputs first and second control signals $\phi 1$ and $\phi 2$ and a column address strobe signal CAS through second to fourth input lines 13, 15 and 17, respectively. The output enable signal generator 12 combines logically the column address strobe signal CAS, the first and second control signals $\phi 1$ and $\phi 2$ and the variably delayed address transition detect signal to generate an output enable signal OE of a desired logic (for example, high). Then, the output enable signal generator 12 outputs the output enable signal OE through its output line 27 to a data output buffer 16. In result, in the case where the semiconductor memory device has the repaired memory cell, the output enable signal OE is generated by the output enable signal generator 12 at a time point delayed by the first predetermined time period from the generation of the address transition detect signal /PC, so that it is synchronized with a data signal DO. On the contrary, in the case where the semiconductor memory device has only the normal memory cells, the output enable signal OE is generated by the output enable signal generator 12 at a time point delayed by the second predetermined time period from the generation of the address transition detect signal /PC. The first control signal $\phi 1$ may be a column decoding signal which is generated by a column decoder (not shown), and the second control signal $\phi 2$ may be a read signal.

The data output buffer 16 inputs the data signal DO from the memory cells (not shown) through a fifth input line 19. When the output enable signal OE from the output enable signal generator 12 has the desired logic (for example, high), the data output buffer 16 is driven to buffer the data signal DO from the fifth input line 19. Then, the data output buffer 16 outputs the buffered data signal through its output line 21 externally. In response to the output enable signal OE being generated by the output enable signal generator 12 at the different time points, the data output buffer 16 can stably buffer the data signal when the semiconductor memory device has the repaired memory cell, whereas output it within a short time when the semiconductor memory device has only the normal memory cells.

Figure 2:
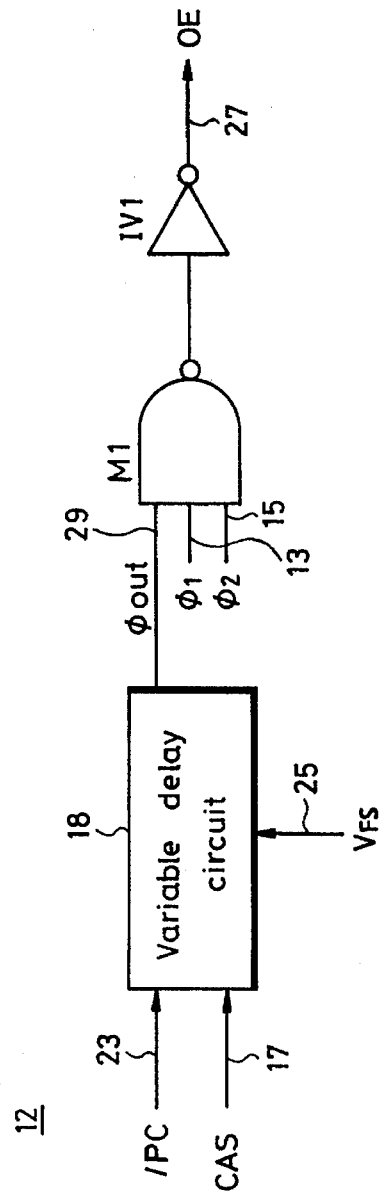
FIG. 2 is a detailed circuit diagram of an output enable signal generator in FIG. 1.

Referring to FIG. 2, there is shown a detailed circuit diagram of the output enable signal generator 12 in FIG. 1. As shown in this drawing, the output enable signal generator 12 includes a variable delay circuit 18 for inputting the address transition detect signal /PC from the output line 23 of the address transition detector 10 in FIG. 1, the delay control signal $V_{FS}$ from the output line 25 of the delay controller 14 in FIG. 1 and the column address strobe signal CAS from the fourth input line 17 in FIG. 1. The variable delay circuit 18 is adapted to delay variably the address transition detect signal /PC from the address transition detector 10 according to the logic state of the delay control signal $V_{FS}$ from the delay controller 14 to generate a variable delay signal $\phi$out. The column address strobe signal CAS switches the address transition detect signal /PC to the variable delay circuit 18 or the variable delay signal $\phi$out to an output line 29 of the variable delay circuit 18. When the delay control signal $V_{FS}$ from the delay controller 14 is high in logic, the variable delay signal $\phi$out has the same waveform as that of the address transition detect signal /PC delayed and inverted by the first predetermined time period. On the contrary, if the delay control signal $V_{FS}$ from the delay controller 14 is low in logic, the variable delay signal $\phi$out has the same waveform as that of the address transition detect signal /PC delayed and inverted by the second predetermined time.

The output enable signal generator 12 further includes a NAND gate M1 for inputting the variable delay signal $\phi$out from the output line 29 of the variable delay circuit 18. Also, the NAND gate M1 inputs the first and second control signals $\phi 1$ and $\phi 2$ from the second and third input lines 13 and 15 in FIG. 1, respectively, The NAND gate M1 is adapted to NAND the variable delay signal $\phi$out from the variable delay circuit 18 with the first and second control signals $\phi 1$ and $\phi 2$ from the second and third input lines 13 and 15 and to output the resultant signal to a first inverter IV1. The output signal from the NAND gate M1 is low in logic when the variable delay signal $\phi$out from the variable delay circuit 18 and the first and second control signals $\phi 1$ and $\phi 2$ from the second and third input lines 13 and 15 are all high in logic. The first inverter IV1 is adapted to invert the output signal from the NAND gate M1 to generate the output enable signal OE. The output enable signal OE has a high logic pulse and is supplied through the output line 27 to the data output buffer 16 in FIG. 1.

Figure 3:
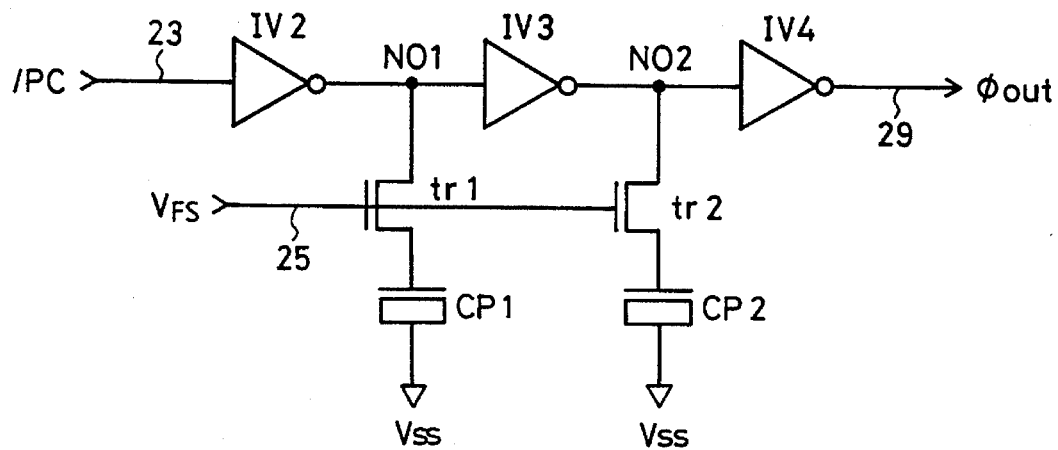
FIG. 3 is a detailed circuit diagram of a variable delay circuit in FIG. 2.

Referring to FIG. 3, there is shown a detailed circuit diagram of the variable delay circuit 18 in FIG. 2. As shown in this drawing, the variable delay circuit 18 includes a second inverter IV2 connected between the output line 23 of the address transition detector 10 in FIG. 1 and a first node NO1, a third inverter IV3 connected between the first node NO1 and a second node NO2, and a fourth inverter IV4 connected between the second node NO2 and the output line 29 in FIG. 2. The second to fourth inverters IV2–IV4 constitutes an inverter chain for delaying sequentially the address transition detect signal/PC from the output line 23 of the address transition detector 10 by their propagation delay time periods.

The variable delay circuit 18 further includes first and second NMOS transistors tr1 and tr2 having gates for inputting commonly the delay control signal $V_{FS}$ from the output line 25 of the delay controller 14 in FIG. 1. When the delay control signal $V_{FS}$ from the delay controller 14 is high in logic, namely, when the semiconductor memory device has the repaired memory cell, the first NMOS transistor tr1 is turned on to connect a first capacitor CP1 between the first node NO1 and a ground voltage source Vss. The first capacitor CP1 is adapted to delay the inverted address transition detect signal from the second inverter IV2 to the third inverter IV3 for a desired time period.

Similarly, if the delay control signal $V_{FS}$ from the delay controller 14 is high in logic, the second NMOS transistor tr2 is turned on to connect a second capacitor CP2 between the second node NO2 and the ground voltage source Vss. The second capacitor CP2 is adapted to delay the re-inverted address transition detect signal from the third inverter IV3 to the fourth inverter IV4 for the desired time period.

In result, in the case where the delay control signal $V_{FS}$ from the delay controller 14 is low in logic, the variable delay signal $\phi$out generated on the output line 29 connected to the fourth inverter IV4 has the same waveform as that of the address transition detect signal delayed and inverted by the second predetermined time period by the second to fourth inverters IV2–IV4. On the contrary, in the case where the delay control signal $V_{FS}$ from the delay controller 14 is high in logic, the variable delay signal φout generated on the output line 29 has the same waveform as that of the address transition detect signal delayed and inverted by the first predetermined time period by the second to fourth inverters IV2–IV4 and the first and second capacitors CP1 and CP2. Then, the variable delay signal φout generated on the output line 29 is supplied to the NAND gate M1 in FIG. 2.

Figure 4:
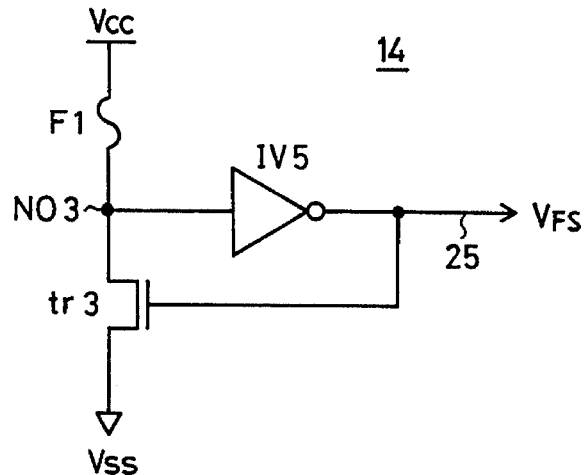
FIG. 4 is a detailed circuit diagram of a delay controller in FIG. 1.

Referring to FIG. 4, there is shown a detailed circuit diagram of the delay controller 14 in FIG. 1. As shown in this drawing, the fuse F1 is connected between a supply voltage source Vcc and a third node NO3. The delay controller 14 further includes a fifth inverter IV5 and a third NMOS transistor tr3 connected between the third node NO3 and the output line 25 for forming a circulating loop. The fuse F1 has a high resistance, and is selectively opened or closed by the manufacturer according to whether the semiconductor memory device has the repaired memory cell, as stated previously. In practice, in the case where the semiconductor memory device has the repaired memory cell, the fuse F1 is opened by the manufacturer. When the fuse F1 is opened, no voltage is applied to the third node NO3, thereby causing the third node NO3 to go low in logic. In this case, the fifth inverter IV5 inverts a low logic signal on the third node NO3 and generates the resultant high logic delay control signal $V_{FS}$. In response to the high delay control signal $V_{FS}$ from the fifth inverter IV5, the third NMOS transistor tr3 is turned on to transfer a ground voltage from the ground voltage source Vss to the third node NO3. In result, the third NMOS transistor tr3 forms a latch with the fifth inverter IV5 to allow the low logic state to be stably maintained at the third node NO3.

On the contrary, in the case where the semiconductor memory device has only the normal memory cells, the fuse F1 is not opened, so as to act as a current limiting resistor. In this case, a supply voltage from the supply voltage source Vcc is applied to the third node NO3 through the fuse F1, thereby causing a high logic signal to be generated on the third node NO3. The fifth inverter IV5 inverts the high logic signal on the third node NO3 and generates the resultant low logic delay control signal $V_{FS}$. The third NMOS transistor tr3 is turned off in response to the low delay control signal $V_{FS}$ from the fifth inverter IV5. Then, the delay control signal $V_{FS}$ from the fifth inverter IV5 is supplied through the output line 25 to the variable delay circuit 18 in FIG. 2.

As apparent from the above description, according to the present invention, the data output buffer control circuit can control the operating point of the data output buffer according to whether the semiconductor memory device has the repaired memory cell. In the case where the semiconductor memory device has the repaired memory cell, the data output buffer control circuit is operated in such a manner that the data output buffer can stably buffer the data signal. In the case where the semiconductor memory device has only the normal memory cells, the data output buffer control circuit is operated in such a manner that the data output buffer can be driven at a high speed. Therefore, the data output buffer control circuit of the present invention has the effect of enhancing a data read speed of the semiconductor memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. In a semiconductor memory device having a plurality of memory cells and a data output buffer for transferring a data signal from said memory cells to external peripheral circuits, a circuit for controlling said data output buffer, comprising:

address transition detection means for detecting a transition of an address signal to generate an address transition detect signal in a pulse form;

delay control means for generating a delay control signal, said delay control signal having a logic value set by a manufacturer according to whether said semiconductor memory device has a repaired memory cell; and output enable signal generation means for generating an output enable signal at a time point delayed by a time period from the generation of the address transition detect signal from said address transition detection means, the time period being determined based on a logic value of the delay control signal from said delay control means, said output enable signal generation means outputting the output enable signal to said data output buffer to control an operating point of said data output buffer.

2. A data output buffer control circuit as set forth in claim 1, wherein said delay control means includes:

a fuse opened or closed by the manufacturer according to whether said semiconductor memory device has the repaired memory cell; and latch means for latching an output signal from said fuse and outputting the latched signal as the delay control signal to said output enable signal generation means.

3. A data output buffer control circuit as set forth in claim 1, wherein said output enable signal generation means includes:

variable delay means for delaying variably the address transition detect signal from said address transition detection means by the time period based on the logic value of the delay control signal from said delay control means; and logic means for combining logically an output signal from said variable delay means with a column address strobe signal, a column decoding signal and a read signal and outputting the resultant signal as the output enable signal to said data output buffer.

\* \* \* \* \*